US008841962B1

(12) United States Patent
Trampitsch (10) Patent No.: US 8,841,962 B1
(45) Date of Patent: Sep. 23, 2014

(54) LEAKAGE COMPENSATION FOR SWITCHED CAPACITOR INTEGRATORS

(71) Applicant: Linear Technology Corporation, Milpitas, CA (US)

(72) Inventor: Gerd Trampitsch, Unterfoehring (DE)

(73) Assignee: Linear Technology Corporation, Milpitas, CA (US)

( * ) Notice: Subject to any disclaimer, the term of this patent is extended or adjusted under 35 U.S.C. 154(b) by 0 days.

(21) Appl. No.: 13/871,981

(22) Filed: Apr. 26, 2013

(51) Int. Cl.
*H03K 5/00* (2006.01)
*H03F 1/34* (2006.01)

(52) U.S. Cl.
CPC .................................. *H03F 1/34* (2013.01)
USPC .......................... 327/554; 327/337; 327/552

(58) Field of Classification Search
USPC .................... 327/551–559, 336–337
See application file for complete search history.

(56) References Cited

U.S. PATENT DOCUMENTS

| | | | | |
|---|---|---|---|---|
| 4,636,738 | A | * | 1/1987 | Westwick et al. .................. 330/9 |
| 6,172,631 | B1 | | 1/2001 | Tsai et al. |
| 6,753,912 | B1 | | 6/2004 | Wayne |
| 7,138,848 | B2 | | 11/2006 | Wu et al. |
| 2012/0249239 | A1 | | 10/2012 | Garrity |
| 2013/0057301 | A1 | * | 3/2013 | Balachandran et al. ...... 324/679 |

FOREIGN PATENT DOCUMENTS

EP        0293020 A1    11/1988

OTHER PUBLICATIONS

T. Fulop and F. Montecchi, "Switched-Capacitor Biquad Building Block with Offset-Insensitive Time-Continuous Feedback Integrators," 1988 IEEE International Symposium on Circuits and Systems. Proceedings, 2:1257-1260 (Jun. 1988).

C. Enz and G. Temes, "Circuit Techniques for Reducing the Effects of Op-Amp Imperfections: Autozeroing, Correlated Double Sampling, and Chopper Stabilization," Proceedings of the IEEE, 84(11): 1584-1614 (Nov. 1996).

Kajita et al., "Correlated Double Sampling Integrator Insensitive to Parasitic Capacitance," Electronic Letters, 37 (3):151-153 (Feb. 2001).

Linear Technology Product Information, "LTC2450—Easy-to-Use, Ultra-Tiny ΔΣ ADC," Linear Technology, 2007.

Fulop, T., et al. "Switched-Capacitor Biquad Building Block With Offset-Insensitive Time-Continuous Feedback Integrators", Circuits and Systems, 1988., IEEE International Symposium On, IEEE, Jun. 7, 1988, p. 1257 XP032410172.

Kajita, T., et al., "Correlated Double Sampling Integrator Insensitive to Parasitic Capacitance", Electronic Letters, IEE Stevenage, GB, vol. 37, No. 3, Feb. 1, 2001, pp. 151-153 XP006016250.

May 13, 2014 Extended European Search Report for European Patent Application No. 14000727.9.

* cited by examiner

*Primary Examiner* — Dinh Le
(74) *Attorney, Agent, or Firm* — Schiff Hardin LLP (57) ABSTRACT

Methods and systems for a differential correlated double sampling (CDS) switched capacitor integrator circuit. The circuit includes a differential amplifier that has a differential input and a differential output. There is a first feedback path between the negative output node and the positive input node, and a second feedback path between the positive output node and the negative input node. Each feedback path includes an integration capacitor and at least one switch that has a parasitic capacitance. A first capacitive element is coupled between the negative input node and the negative output node, and a second capacitive element is coupled between the positive input node and the positive output node. Each capacitive element is configured to cancel the parasitic capacitance of its corresponding feedback path.

13 Claims, 6 Drawing Sheets

LEAKAGE COMPENSATION FOR SWITCHED CAPACITOR INTEGRATORS

TECHNICAL FIELD

This disclosure relates to switched capacitor (SC) circuits, and more particularly, to a correlated double sampling (CDS) switched capacitor integrator.

DESCRIPTION OF RELATED ART

In recent years there has been an effort to improve methods of and circuits for acquiring analog signals and converting them to the digital domain. Although real world signals are analog, it is often desirable to convert them to the digital domain using analog-to-digital converters (ADCs). For example, sampling systems are frequently found in popular consumer electronic devices such as MP3 players, DVD players and cellular telephones. Other popular uses of sampling systems include those related to data acquisition, test and measurement, and control system applications. Sampling systems and sample-based technology may be found in the electronic components used to construct such devices, which include analog-to-digital converters, switched capacitor networks, signal acquisition circuitry, comparators, and others.

Analog processing circuits generally include a gain stage configured to amplify the input analog signal. Switched-capacitor gain circuits are frequently used to provide such amplification. Typical switched-capacitor gain circuits include an amplifier and a set of capacitors to store the input signal.

Although present switched-capacitor gain circuits generally perform their function, they do have imperfections. For example, flicker noise, finite gain of the amplifier, and DC offsets detrimentally affect the achievable accuracy of switched-capacitor gain circuits.

To compensate for some switched-capacitor gain circuits, a technique known as correlated double sampling (CDS) is used. CDS is a method to measure electrical values such as voltages or currents that allows removing of undesired offset. The output of a sensor is measured twice: (i) in a first (e.g., known) condition and (ii) in a second (e.g., unknown) condition. The value measured from the first condition is subtracted from the second condition to generate a value with a known relation to the physical quantity being measured. This technique effectively doubles the gain of the charge sharing switched capacitor operational amplifier, while adding extra phase.

Although CDS techniques may improve the achievable accuracy of switched capacitor circuits, they come at a cost. Parasitic capacitances of the prior art integration switches may cause leaky integrators that limit the maximum achievable resolution of Analog-to-Digital Converters (ADCs), such as sigma delta ADCs. First order sigma delta converters are more susceptible to integrator leakage than higher order modulators. Often, first order sigma delta ADCs are preferred over higher order modulators due to their smaller size, equal weight allocation to each input sample, and ease of design (e.g., first order sigma delta ADC's are inherently stable).

Figure 1:
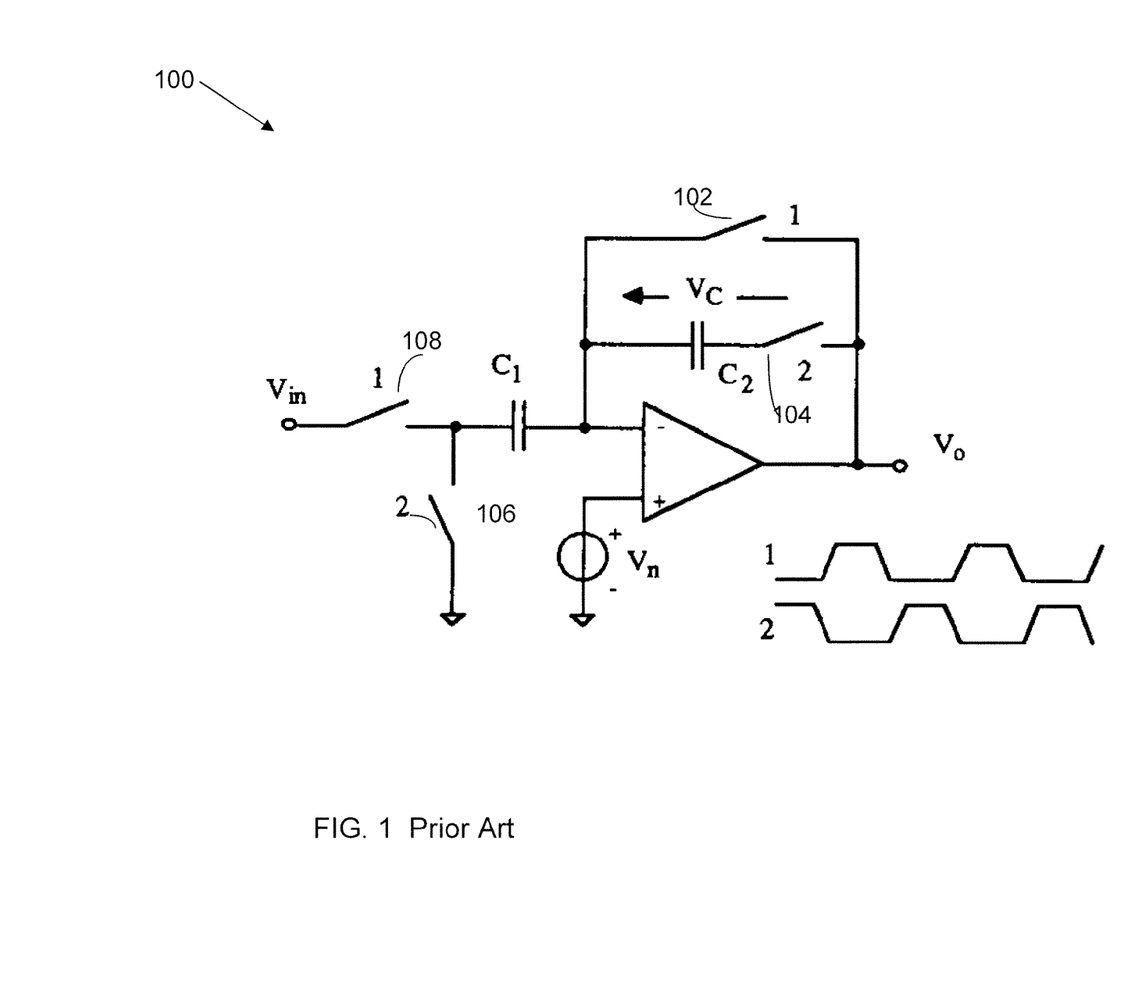
FIG. 1 illustrates a conventional switched capacitor integrator without leakage compensation.
Figure 6A:
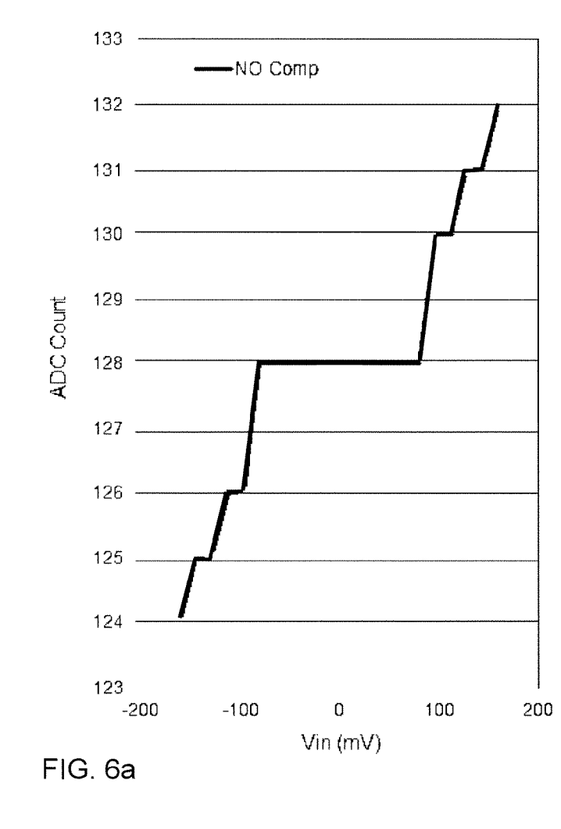
FIG. 6a illustrates an exemplary transfer curve for an ADC that does not compensate for the parasitic capacitance of the integration switches.

Integrator leakage results in dead zones of the ADC transfer curve. For example, large integral non-linearity (INS) errors may be introduced due to the leakage currents. First order sigma-delta ADCs employing the simplest CDS sampling scheme are therefore presently limited to 16 bit resolution. FIG. 1 illustrates a switched capacitor integrator, as described by T. Fulop, and F. Montecchi, *Switched Capacitor Biquad Building Block with Offset-Insensitive Time-Continuous Feedback Integrators*, IEEE, 1988. The corresponding ADC transfer curve is illustrated in FIG. 6a, which is discussed later.

The CDS integrator circuit 100 is sensitive to parasitic capacitances across the integration switches 102, 104, 106, and 108. For example, in phase 1, the parasitic capacitance of the reset switch 102 is discharged. In phase 2, the parasitic capacitance of switch 102 is in parallel with the integration capacitor C2. Due to the charge redistribution (e.g., from C2 to the parasitic capacitance of switch 102), a portion of the integrated signal is therefore lost.

Figure 2:
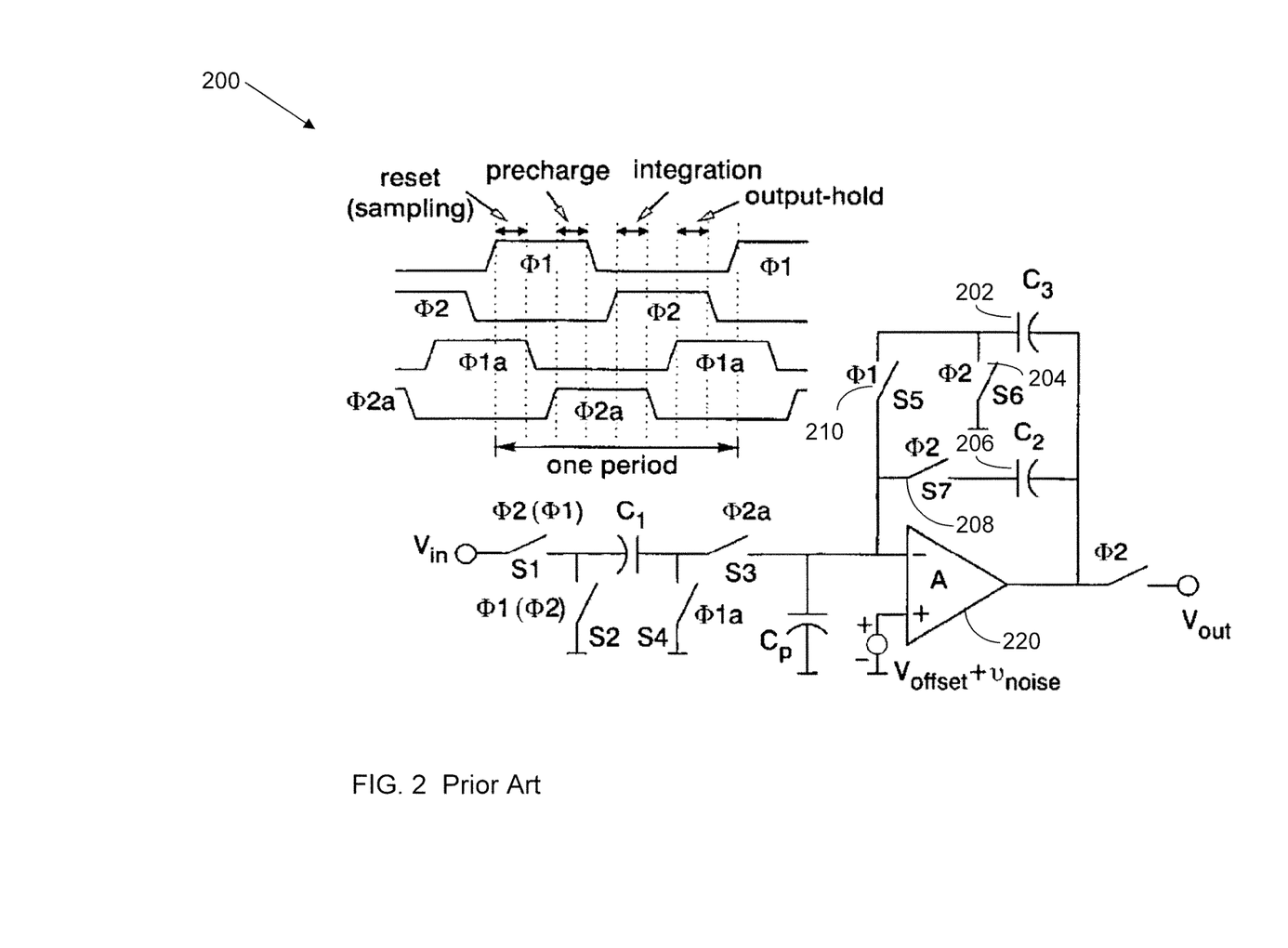
FIG. 2 illustrates a conventional switched capacitor integrator that accommodates leakage compensation via a large capacitor that limits the bandwidth.

FIG. 2 illustrates a switched capacitor integrator, as described by T. Kajita, G. Temes, and U. Moon, *Correlated Double Sampling Integrator Insensitive to Parasitic Capacitance*, Electronic Letters, February 2001, Vol. 37 No. 3. Circuit 200 uses an additional capacitor 202, which is of the same size (e.g., capacitance) as the integration capacitor 206, to desensitize the circuit 200 to the parasitic capacitance of the integration switches (i.e., 204, 208, and 210). In phase 2, the capacitor 202 additionally loads the output of the amplifier 220, thereby causing bandwidth constraints when used with single stage amplifiers.

Figure 3:
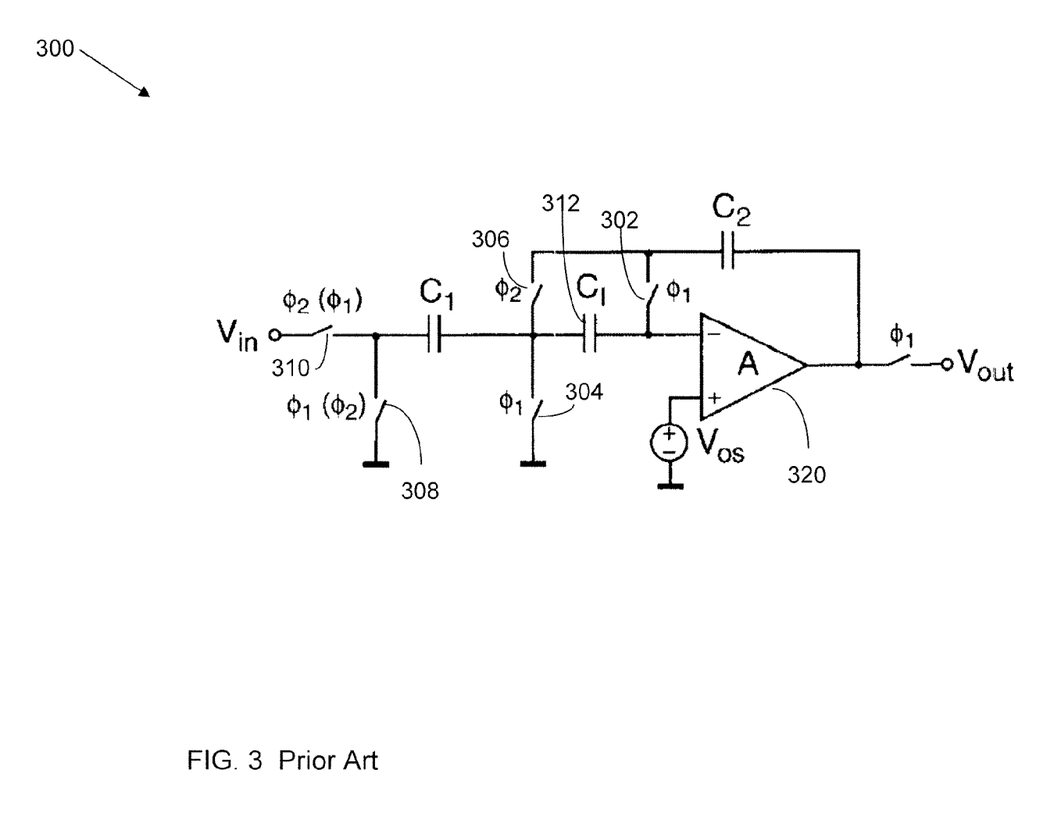
FIG. 3 illustrates a conventional switched capacitor integrator that accommodates leakage compensation with a compensation capacitor that leads to an offset.

FIG. 3 illustrates a switched capacitor integrator, as described by C. Enz and G. Temes, *Circuit Techniques for Reducing the Effects of Op-Amp Imperfections: Autozeroing, Correlated Double Sampling, and Chopper Stabilization*, IEEE, Vo. 84. November 1996. Circuit 300 uses an additional capacitor 312 to store the offset of the amplifier 320. Mismatch of the sampling switches 302, 304, 306, 308 and 310 results in non-ideal offset compensation that ultimately leads to an integration signal that is partially offset.

Accordingly, known correlated double sampling integrators typically have a low sensitivity to the parasitic capacitance of the integration switches. Traditional ways of addressing this concern resulted in more complex circuits that use more real estate by including an additional capacitor of the same size as the integration capacitor, an offset storing capacitor, and/or a much larger number of active sampling switches. It would be desirable to provide circuits and methods for a switched capacitor integrator that avoids these problems.

BRIEF DESCRIPTION OF DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

FIG. 4b illustrates the phase timing diagram for the circuit of FIG. 4a.

DETAILED DESCRIPTION OF ILLUSTRATIVE EMBODIMENTS

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

The various methods and circuits disclosed herein relate to differential CDS switched capacitor (SC) integrator circuits that compensate for leakage in the integration capacitor. In accordance with one aspect of the present disclosure, the circuit includes a differential amplifier having inverting and non-inverting inputs and positive and negative outputs. First and second integration capacitors are respectively coupled to the positive and negative outputs. The differential amplifier has a first feedback path between its positive output and its negative input, and a second feedback path between its negative output ands its positive input. Each feedback path has an integration capacitor and one or more integration switches. These integration switches have inherent parasitic capacitance that share the charge with their respective integration capacitors. Capacitive elements are cross coupled between the inputs and outputs of the amplifier, thereby substantially compensating for any charge lost due to the parasitic capacitance of the integration switches.

The capacitive elements may comprise dummy switches that are configured to provide capacitance for compensating for signal loss due to parasitic capacitance of the integration switches. Each dummy switch may be a passive switch that is always open. By using a dummy switch as a capacitive element, the parasitic capacitance of the integration switches can be better tracked and then canceled. For example, the dummy switch has a capacitance that tracks the capacitance of the integration switches over chip process variation, operating temperature changes, and aging.

Thus, each dummy switch is configured to provide parasitic capacitance that is as large (e.g., same capacitance) as the parasitic capacitance associated with the integration switches. For example, each dummy switch may be implemented by a pair of parallel connected transistors similar to a transistor used for each of the integration switches. Metal oxide semiconductor field effect transistors (MOSFETs) may be used for implementing both the dummy switches and the integration switches. For example, the capacitance between the source to drain of the MOSFET dummy switch is used to emulate the parasitic capacitance of the integration switches.

Figure 4A:
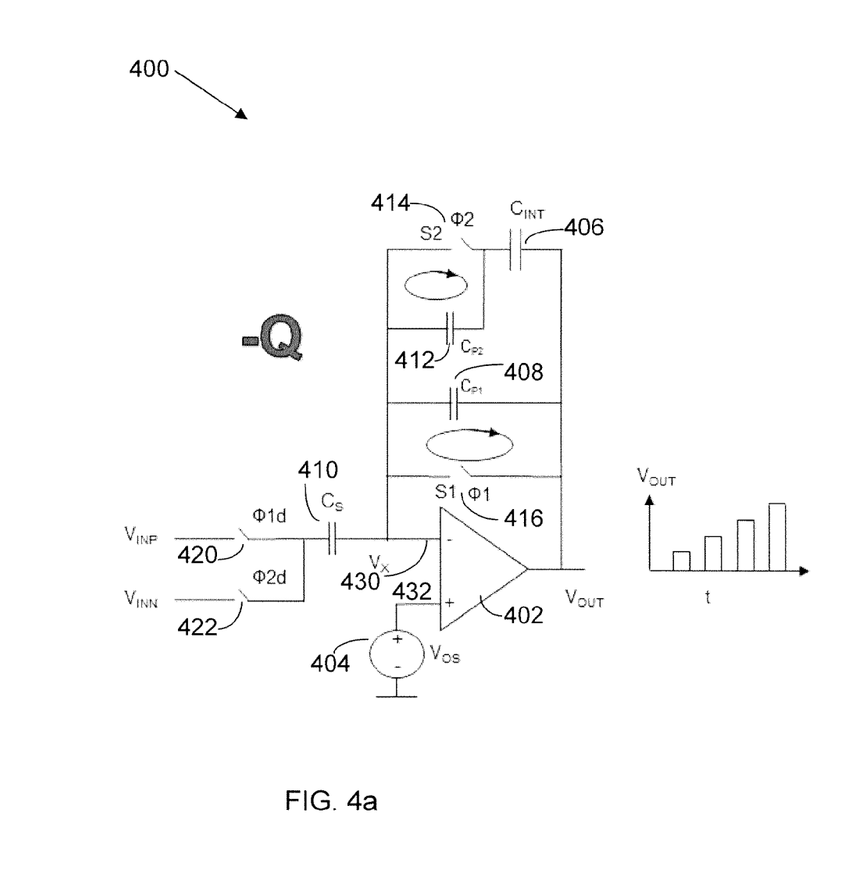
FIG. 4a illustrates a CDS switched capacitor integrator without leakage compensation.

Reference now is made in detail to the examples illustrated in the accompanying drawings and discussed below. FIG. 4a illustrates an exemplary CDS switched capacitor integrator 400 that includes an operational amplifier 402, an integration switch S1 (416) coupled between an inverting input of the amplifier 430 and its output $V_{OUT}$, and an integration switch S2 (414) coupled between the inverting input 430 of the amplifier 402 and an integration capacitor $C_{INT}$ (406) that is coupled to the output $V_{OUT}$. A sampling capacitor Cs (410) is coupled between the inverting input 430 of the amplifier 402 and a pair of parallel input switches 420 and 422. The pair of input switches are supplied with input voltages $V_{INP}$ and $V_{INN}$. There is an offset voltage $V_{OS}$ at the non-inverting input 404 of the amplifier 402. Due to the virtual short between the non-inverting input 432 and the inverting input 430 of the amplifier 402, the offset voltage appears on the non-inverting input 430. The offset voltage is discussed in more detail later.

Further, FIG. 4a illustrates parasitic capacitance $C_{P1}$ (408) associated with the switch S1 (416) and parasitic capacitance $C_{P2}$ (412) associated with the switch S2 (414). The parasitic capacitances $C_{P1}$ (408) and $C_{P2}$ (412) are in parallel to the switches S1 (416) and S2 (414), respectively.

Figure 4B:
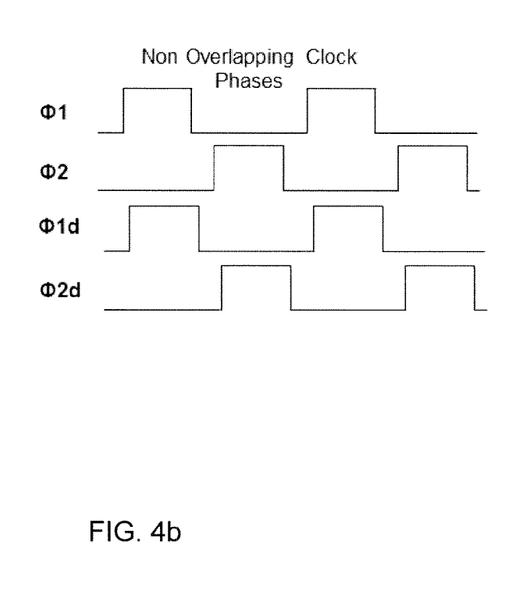

Circuit 400 is best understood in reference with FIG. 4b, which shows a timing diagram illustrating clock phases of the integrator 400. During phase φ1, the operational amplifier 402 is in unity gain configuration because switch S1 (416) is closed while switch S2 (414) is open. Since switch 420 is closed, the sampling capacitor $C_S$ 410 is charged to $V_{INP}$-$V_{OS}$, while the parasitic capacitance of switch S1 (i.e., $C_{P1}$) is discharged. During the same phase φ1, the parasitic capacitance of switch S2 (i.e., $C_{P2}$) is charged to the voltage on integration capacitor $C_{INT}$ 406 via charge redistribution. Put differently, when switch S2 (414) is open, its parasitic capacitance $C_{P2}$ (412) removes charge from the integration capacitor $C_{INT}$ (406) through charge redistribution.

During phase φ2, the reset switch S1 (416) opens and switch S2 (414) closes, thereby creating a path between the integration capacitor $C_{INT}$ (406) and node $V_X$ (i.e., the inverting input of amplifier 402). Further, the parasitic capacitance of switch S2 (i.e., $C_{P2}$) is discharged via switch S2 (414) since it is now closed. During this phase φ2, switch 420 is open while switch 422 is closed. Thus, sampling capacitor $C_S$ 410 is connected to input $V_{INN}$. The charge that is integrated by operational amplifier 402 is provided by equation 1 below:

$$Q \approx C_S / (V_{INP} - V_{INN}) \qquad [EQ. 1]$$

Closing switches S1 (416) or S2 (414), which are in parallel with their parasitic capacitances $C_{P1}$ and $C_{P2}$, respectively, leads to signal loss. For example, during φ1, the parasitic capacitance CP1 of switch S1 (416) is discharged. However, during phase φ2, where switch S1 (416) is in parallel with the integration capacitor $C_{INT}$ (406), discharged parasitic capacitance CP1 of switch S1 (416) shares the charge of the integration capacitor $C_{INT}$ through charge sharing. The charge lost during one sampling period is estimated by equation 2 below:

$$-Q_{(lost\ during\ a\ sampling\ period)} \approx V_{OUT}/(2C_P) \qquad [EQ. 2]$$

where:
$V_{OUT}$ is the voltage at the output of the amplifier 402
$C_P$ is the respective parasitic capacitance of the switch Thus, unless the signal that was stored across integration capacitor $C_{INT}$ (406) was 0V, there is a charge sharing concern that reduces the accuracy of the integration circuit 400. This leakage effect is sometimes referred to as a leaky integrator.

Thus, the signal (e.g., charge) lost during a sampling interval is a function of the parasitic capacitance of the switches (e.g., CP1 and CP2) and the signal stored in the integration capacitor. If switches S1 (416) and S2 (412) are of equal size then $C_{P1}=C_{P2}$, represented herein as $C_P$. Accordingly, the charge lost (−Q) is a quantity that can be calculated. What is needed is a positive charge (e.g., +Q) to counteract the charge lost due to the charge sharing discussed above.

In a fully differential switched capacitor integrator circuit, the outputs are of equal magnitude but of opposite polarity (e.g., $V_{OUTP}=-V_{OUTN}$). If each differential input includes an element that tracks the parasitic capacitance of the switches and each such element is cross coupled to the differential output, respectively, an equal but opposite charge (+Q) is added to each positive and negative feedback loop of the amplifier 402, respectively. This opposite charge (+Q) counteracts the charge lost (−Q) due to the charge sharing of the integration switches with the integration capacitor. This concept is better described below in the context of FIG. 5.

Figure 5:
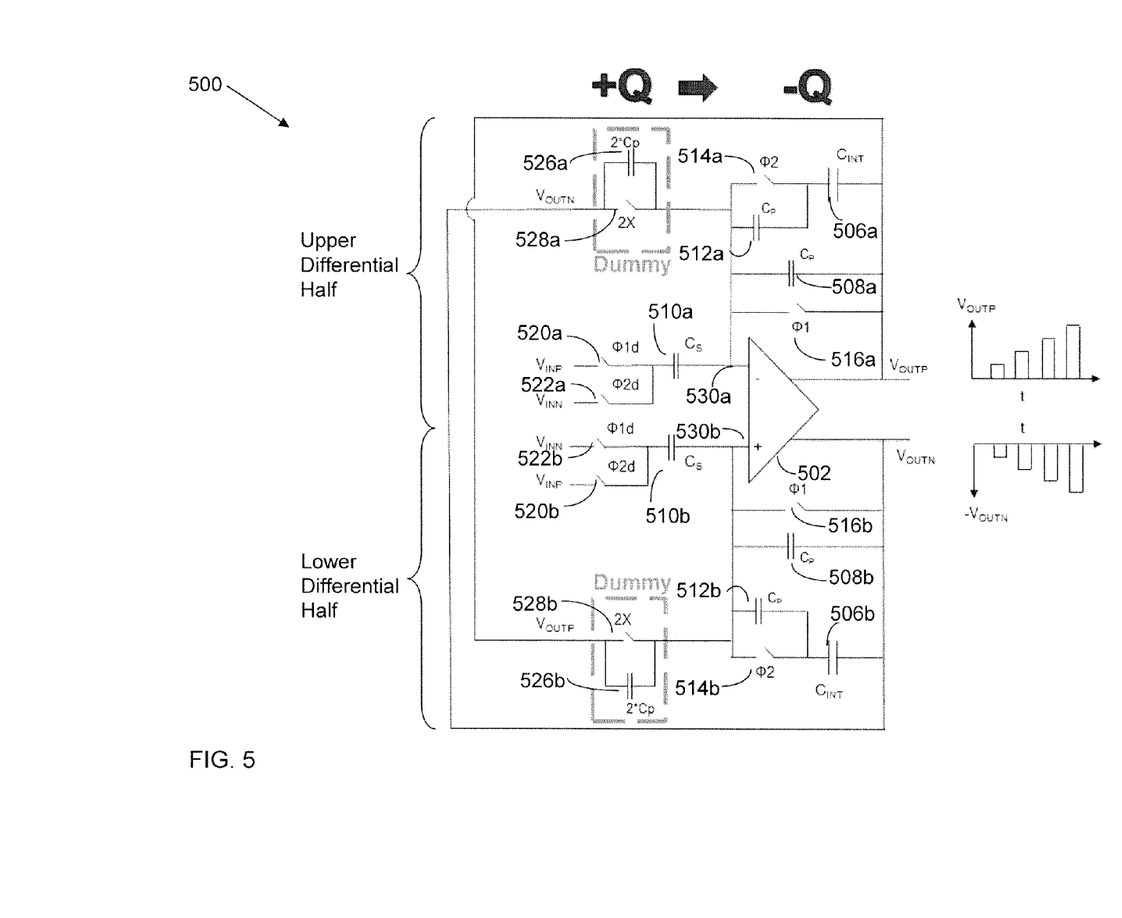
FIG. 5 illustrates an exemplary differential CDS switched capacitor integrator circuit that includes dummy capacitive elements, consistent with an embodiment of the present disclosure.

FIG. 5 illustrates an exemplary differential CDS switched capacitor integrator circuit that includes dummy capacitive elements, consistent with an embodiment of the present disclosure. Circuit 500 includes an upper half and a lower half, which are mutually similar. The two halves can be viewed as single-ended sample circuits that have been matted together to form a differential configuration. Accordingly, some aspects of circuit 500 will be discussed in the context of the upper half and not repeated for the bottom half for brevity.

Circuit 500 includes an operational amplifier 502, an integration switch 516a coupled between a negative (inverting) input of the amplifier 502 and its positive output node $V_{OUTP}$, and an integration switch 514a coupled between the negative (inverting) input 530a of the amplifier 502 and an integration capacitor 506a that is coupled to the positive output node $V_{OUTP}$. A sampling capacitor Cs (510a) is coupled between the negative input node 530a of the amplifier 502 and a pair of parallel input switches 520a and 522a. The pair of input switches are supplied with input voltages $V_{INP}$ and $V_{INN}$, respectively.

Circuit 500 includes a capacitive element 528a that is coupled between the negative input node 530a and the negative output node $V_{OUTN}$ of the amplifier 502. By way of example, the capacitance of the capacitive element 528a is illustrated separately (i.e., in parallel) as a capacitor 526a. Similarly, the lower differential half includes a capacitive element 526b that is coupled between the positive input node 530b and the positive output node $V_{OUTP}$ of the amplifier 502. The capacitive element 528a is configured to cancel the parasitic capacitance of the 512a and 508a of switches 514a and 516a, respectively. The capacitance of the capacitive element 528a equals the total parasitic capacitance of switches 514a and 516a. For example, if switches 514a and 516a are of similar size (and thus have equal parasitic capacitance Cp), then the capacitance of the capacitive element 528a is 2×Cp.

Thus, the capacitive element 528a may be a dummy switch that has the total capacitance of switches 516a and 512a. The dummy switches discussed herein may be passive switches (e.g., they are always open). In various embodiments, switches may be used to better track the capacitance of the switches 516a. For example, switches 516a and 514a, as well as dummy switch 528a may be MOSFET switches. The drain to source capacitance of a MOSFET may be used to implement the capacitive element 528a In one embodiment, the dummy switch 528a may comprise a MOSFET having a channel width that is twice the channel width of the MOSFET used for switch 516a or 514a. In another embodiment, the dummy switch 528a may comprise a pair of MOSFETs connected in parallel (e.g., one for each switch 514a and 516a).

Since the dummy switch 528a and the switches 516a and 514a have a similar structure, the dummy switch 528a can better track the process, temperature, and even degradation (e.g., aging) of the capacitance of the switches 516a and 514a. In addition, the dummy switch may have a substantially similar layout as switches 514a and 516a for even better tracking of the parasitic capacitance. Thus, if the capacitance of switches 514a and 516a varies, the dummy switch 528a tracks the variation in its own capacitance 526a due to its similar structure and size.

The size of each dummy switch may be selected so as to provide dummy parasitic capacitance $2*C_P$, which is about two times larger than the parasitic capacitance $C_p$ of each integration switch (i.e., when the switches 516a and 512a have equal capacitance). Put differently, dummy switch 528 has a capacitance that is equal to the total capacitance of the switches 512a and 516a.

FIG. 6a illustrates an exemplary transfer curve for an ADC that does not compensate for the parasitic capacitance of the integration switches, such as that of circuit 100. The curve in FIG. 6a highlights the nonlinearity and imprecision of an ADC that does not accommodate for the charge sharing effect of the integration switches.

Figure 6B:
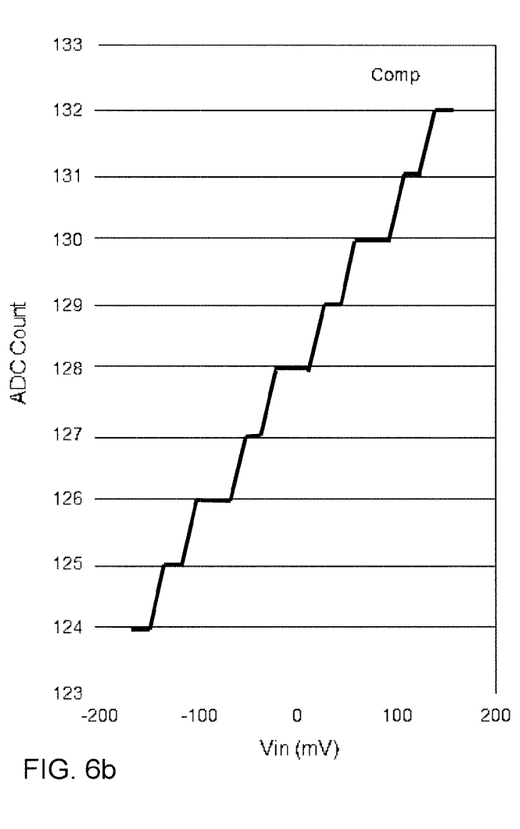
FIG. 6b illustrates an exemplary transfer curve for an ADC that compensates for the parasitic capacitance of the integration switches, consistent with an embodiment of the present disclosure.

In contrast FIG. 6b illustrates an exemplary transfer curve for an ADC that compensates for the parasitic capacitance of the integration switches by including dummy capacitances. These dummy capacitances are cross-coupled to the output to provide a charge that is substantially equal in magnitude but opposite in polarity to the charge lost due to charge sharing from the respective switches that are being compensated. FIG. 6b illustrates that the linearity and accuracy is improved when the charge lost due to the parasitic capacitance of the integration switches is compensated for using the concepts described herein.

The components, steps, features, objects, benefits and advantages that have been discussed herein are merely illustrative. None of them, nor the discussions relating to them, are intended to limit the scope of protection. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another mode (e.g., voltage, current, charge, time, etc.,), or converted to another state (e.g., from HIGH to LOW and LOW to HIGH) without materially changing the underlying control method. Further, bipolar transistors (e.g., PNP or NPN) can be used instead of MOS transistors. A PNP may be used instead of NPN, and a PMOS may be used instead of NMOS. Accordingly, it is intended that the invention be limited only in terms of the appended claims. The systems described herein could be converted to equivalent digital logic functions and yet be within the scope of the same method.

The scope of the appended claims is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, system, or apparatus that comprises a list of elements does not include only those elements but may include other elements not expressly listed or inherent to such process, method, system, or apparatus. An element proceeded by "a" or "an" does not, without further constraints, preclude the existence of additional system elements in the process, method, system, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A differential correlated double sampling (CDS) switched capacitor integrator circuit, comprising:
    a differential amplifier, comprising:
        a differential input having a negative and a positive input node;
        a differential output having a negative and a positive output node;
    a first feedback path between the positive output node and the negative input node, comprising:
        an integration capacitor; and
        at least one switch having a parasitic capacitance;
    a second feedback path between the negative output node and the positive input node, comprising:
        an integration capacitor; and
        at least one switch having a parasitic capacitance;
    a first capacitive element coupled between the negative input node and the negative output node and configured to cancel the parasitic capacitance of the at least one switch of the first feedback path; and
    a second capacitive element coupled between the positive input node and the positive output node and configured to cancel the parasitic capacitance of the at least one switch of the second feedback path.

2. The circuit of claim 1, wherein:
    the first capacitive element is a dummy switch that has a total capacitance of the at least one switch in the first feedback path; and
    the second capacitive element is a dummy switch that has a total capacitance of the at least one switch in the second feedback path.

3. The circuit of claim 2, wherein each switch and dummy switch is a metal oxide semiconductor field effect transistor (MOSFET).

4. The circuit of claim 3, wherein a drain to source capacitance of each dummy MOSFET switch has the total capacitance of the at least one switch in the first feedback path.

5. The circuit of claim 1, wherein:
    the first and second capacitive elements are configured to track the parasitic capacitance of the at least one switch in the first and second feedback paths, respectively, over at least one of:
        (i) a process change;
        (ii) a temperature change; and
        (iii) an aging of the circuit.

6. The circuit of claim 1, wherein:
    a charge stored in the first capacitive element is equal in magnitude but opposite in polarity to a charge lost due to charge sharing between the integration capacitor and the at least one switch in the first feedback path; and
    a charge stored in the second capacitive element is equal in magnitude but opposite in polarity to a charge lost due to charge sharing between the integration capacitor and the at least one switch in the second feedback path.

7. The circuit of claim 1, wherein:
    the at least one switch in the first feedback path comprises:
        a first switch coupled between the positive output node and the negative input node; and
        a second switch coupled in series between the first input node and the integration capacitor; and
    the at least one switch in the second feedback path comprises:
        a first switch coupled between the negative output node and the positive input node; and
        a second switch coupled in series between the second input node and the integration capacitor.

8. The circuit of claim 7, wherein in both the first and the second feedback paths, the first and second switches are of equal size and have the same parasitic capacitance.

9. The circuit of claim 8, wherein:
    the first capacitive element has a capacitance equal to twice the parasitic capacitance of the first switch of the first feedback path; and
    the second capacitive element has a capacitance equal to twice the parasitic capacitance of the first switch of the second feedback path.

10. The circuit of claim 8, wherein a capacitance of the first and second capacitive elements are equal.

11. The circuit of claim 3, wherein a channel width of the first and second dummy MOSFET switches is each twice a channel width of the at least one switch of the first and second feedback path, respectively.

12. The circuit of claim 3, wherein the first and second dummy MOSFET switches each comprise a pair of MOSFETs having a same size as the at least one switch in the first feedback path.

13. A method of canceling the parasitic capacitance of at least one switch in a first and second feedback paths in a differential correlated double sampling (CDS) switched capacitor integrator circuit that includes a differential amplifier comprising the first feedback path between a positive output node and a negative input node, comprising an integration capacitor and at least one switch having a parasitic capacitance; and the second feedback path between the negative output node and the positive input node, comprising an integration capacitor and at least one switch having a parasitic capacitance, the method comprising:

compensating a charge lost due to a charge sharing between the integration capacitor and the at least one switch in the first feedback path and the second feedback path, respectively;

adding a first charge that is equal in magnitude but opposite in polarity to the charge lost in the first feedback path; and     adding a second charge that is equal in magnitude but opposite in polarity to the charge lost in the second feedback path.

\* \* \* \* \*